United States Patent [19]

Siegel et al.

[11] Patent Number: 4,485,349

[45] Date of Patent: Nov. 27, 1984

[54] STABILIZED MICROWAVE POWER AMPLIFIER SYSTEM

[75] Inventors: Larry E. Siegel, San Jose; John M. Pavkovich, Palo Alto; George E. Jahn, Los Altos, all of Calif.

[73] Assignee: Varian Associates, Inc., Palo Alto, Calif.

[21] Appl. No.: 483,313

[22] Filed: Apr. 8, 1983

[51] Int. Cl.$^3$ .......................... H03F 5/00; H03G 3/20
[52] U.S. Cl. ........................................ 330/3; 330/45; 330/145; 330/284; 330/289
[58] Field of Search ................. 330/3, 44, 45, 59, 129, 330/144, 145, 284, 289, 298, 310; 455/249

[56] References Cited

U.S. PATENT DOCUMENTS 4,360,787 11/1982 Galpin ............................. 330/144 X

*Primary Examiner*—James B. Mullins
*Assistant Examiner*—Steven J. Mottola
*Attorney, Agent, or Firm*—Stanley Z. Cole; Peter J. Sgarbossa

[57] ABSTRACT

A power amplifier including a klystron is stabilized against variations in output power with a simplified servo-loop system and cooperating temperature compensation. The system is fully solid-state, digital, and includes an operator-presettable initial power selector, a power output sensor, comparator logic, variable attenuation responsive to error signals indicative of deviation from the preset power, and temperature compensation means, for assured accuracy and stability.

23 Claims, 4 Drawing Figures

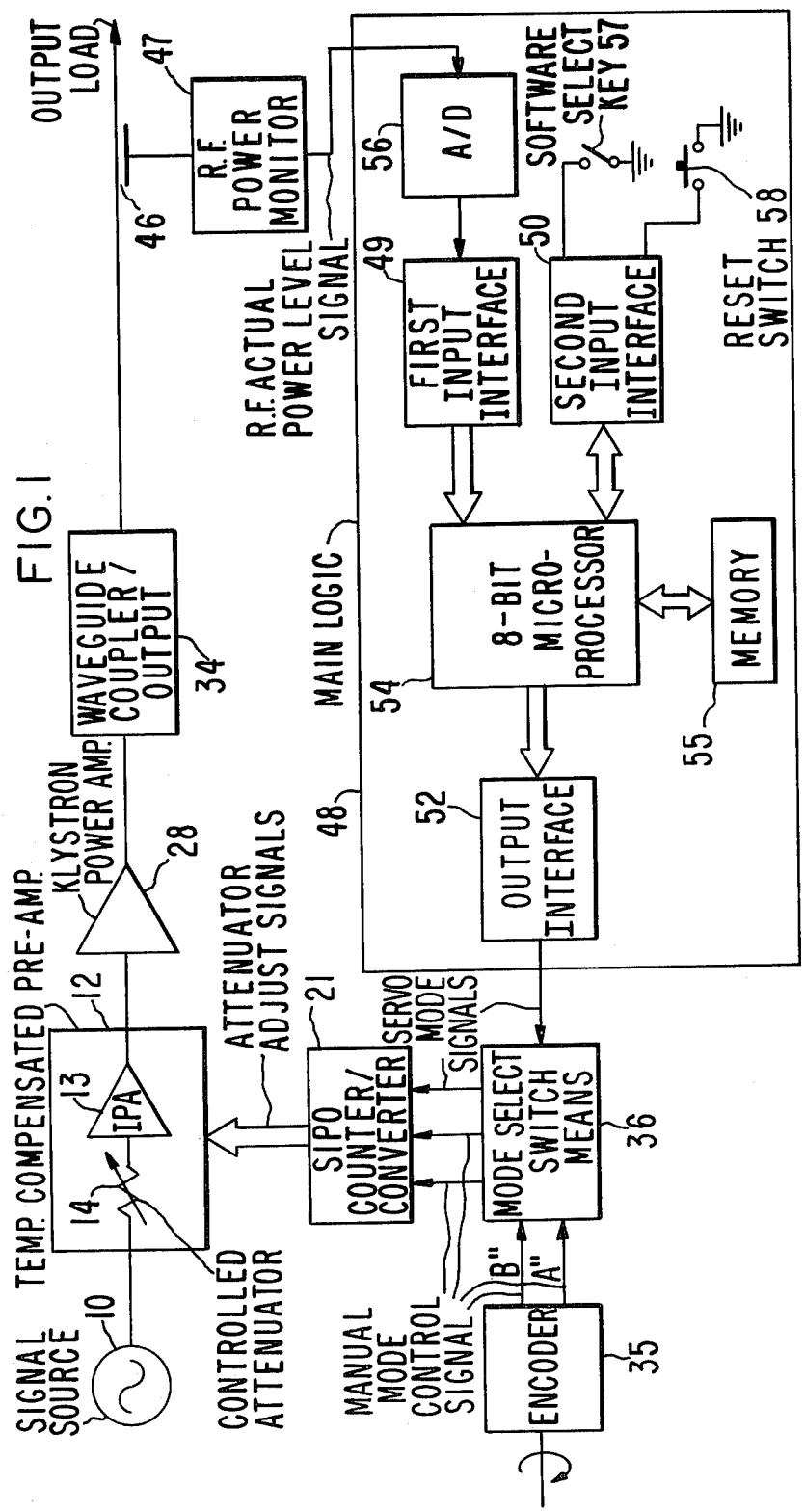

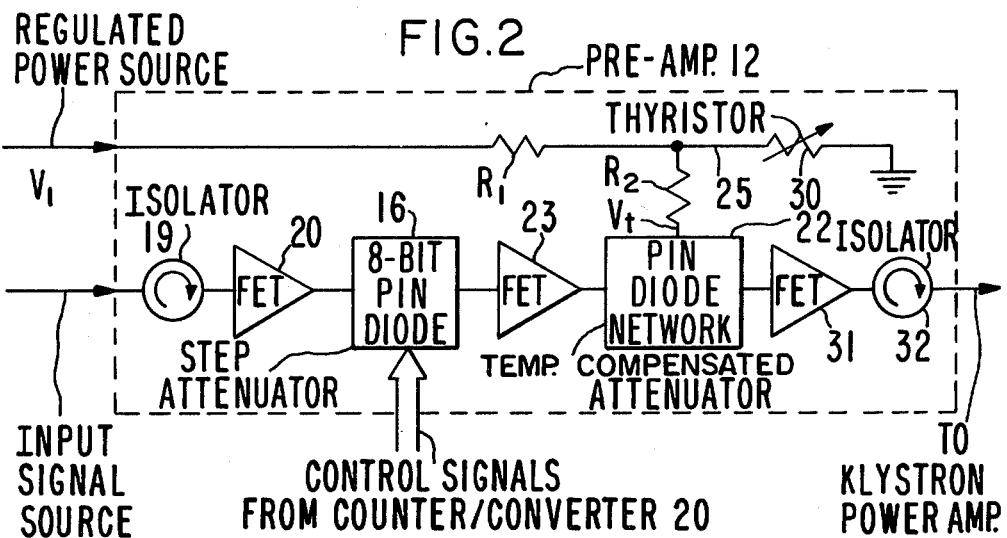
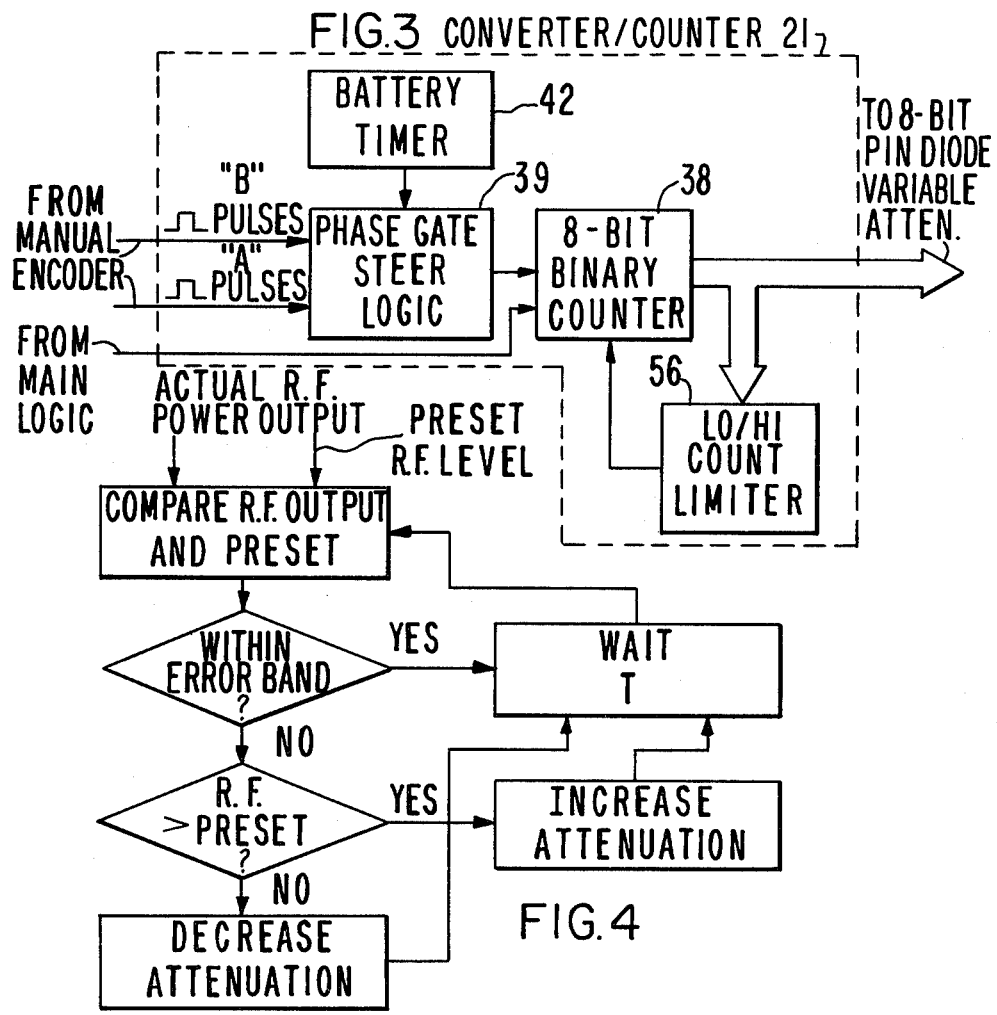

STABILIZED MICROWAVE POWER AMPLIFIER SYSTEM

DESCRIPTION

1. Field of the Invention

The invention relates to high power klystron-based microwave amplifiers. More particularly, the invention relates to microwave power amplifiers having a stabilized power output.

2. Background of the Invention

Klystron power amplifiers have been a familiar fixture in the microwave field for years, and have had certain shortcomings which have been long recognized. Ambient temperature changes have usually caused corresponding severe drift in output power. Severe nonlinearities have also been characteristic of prior units, as have instabilities in the power output due to changes or aging in components with time, for example, those concerned with the klystron beam current.

Prior-art amplifiers have utilized a number of compensating mechanisms to minimize these problems, including regulated power supplies, and gain compensating loops to counteract undesired changes. But such schemes have proved to have instabilities of their own which approached or exceeded those of the amplifying means themselves. Moreover, requirements for modern applications have steadily escalated in severity, rendering the former expedients still less satisfactory. In particular, with the advent of satellite communications, digitally oriented ground stations, and the need to simultaneously handle a large plurality of channels, it has become more important than ever to assure the stability of the amplifiers involved in communicating with the satellite. Variations in the power level of communications in adjacent channels of these typically frequency modulated systems can cause undesirable cross-modulations, or worse. The need for a power amplifier having simplicity and reliability, as well as compatability with modern digital techniques, has become greater than ever as microwave communications have assumed common carrier status.

Accordingly, it is an object of the invention to provide a simple but effective amplifier system suitable for use with satellite ground stations.

It is a further object of the present invention to provide an amplifier with preselectable highly stable power output levels.

It is still a further object of the invention to provide an amplifier whose power output is stable over large variations in ambient temperature.

It is yet a further object of the invention to provide an amplifier having simple digitally-oriented power-level compensation to insure stability.

These objects are achieved by the provision of a stabilized klystron power amplifier system for use with a regulated voltage supply furnishing a regulated voltage. The amplifier system includes a klystron amplifier tube; solid-state preamplifier means for driving this klystron, the preamplifier having a variable gain as a function of temperature, and means for periodically sampling the actual microwave output power from the klystron. Means are provided for converting the periodic sample to a digital signal representing said actual output power. A microprocessor means compares this digital signal to digital reference signals representative of a desired reference output power level, and generates digital correction signals. A first solid-state variable attenuator means in series with the preamplifier varies the gain of the preamplifier in response to these correction signals. A means for furnishing a compensation voltage varying inversely to the variable gain, in response to changes in ambient temperature is also provided, this means accepting the regulated voltage for reference purposes. A second solid-state variable attenuator means is in series with the preamplifier and is responsive to the compensation voltage for varying the gain of the preamplifier accordingly. In this manner the magnitude of the power output is stabilized at the desired preselected power level. The stabilization is carried out with a highly simplified digitized system, which not only takes into account the effect of ambient temperature on the amplifier as well as the compensation loop, but also automatically compensates the output for variations caused by any number of causes in the preamplifier, klystron, or external input or output circuitry as well.

BRIEF DESCRIPTION OF THE DRAWINGS

FIG. 1 is a simplified block diagram setting forth the basic elements of the stabilized klystron amplifier system;

FIG. 2 illustrates a more detailed block diagram of the preamplifier portion of the system of FIG. 1, including temperature compensation;

FIG. 3 illustrates the serial-to-parallel counter portions of the system of FIG. 1 whereby signals from the manual control and the main logic control the variable attenuation of the preamplifier;

FIG. 4 illustrates the flow chart governing the operation of the main logic of FIG. 1.

DESCRIPTION OF THE PREFERRED EMBODIMENT

In the amplifier system broadly shown in the block diagram of FIG. 1, the microwave signal source 10, typically in the frequency range of 5.9 to 6.5 or 14.0 to 14.5 gigahertz, feeds an input signal to preamplifier 12. The preamplifier includes as its main components several FET drive stages represented schematically at 13; and controlled attenuation means 14. As shown in more detail in the FIG. 2 detail of preamplifier 12, the controlled attenuation means involves a step-wise PIN diode attenuator 16, and a continuously variable PIN diode attenuator 18. As illustrated, the preamplifier input signal is directed to a first isolator 19, then to an FET 20, which furnishes the first stage of preamplification, then to 8-bit digital PIN diode network 16, functioning as a 256-step attenuator, and responding to incrementing control signals from an external control source (serial-to-parallel counter 21 of FIG. 1). The values of PIN diode network 16 are chosen to impose an attenuation of from zero to 25 decibels on the signal after the first stage. The attenuator and ancillary circuitry is further configured so that each attenuating step represents a 0.1 decibel attenuation value. Other overall ranges, and step increments within such ranges, could also be chosen, depending on the particular applications being addressed.

The attenuated signal from network 16 is then passed to a further PIN diode network 22, which also functions as an attenuator, after first being passed through another FET 23 functioning as a secondary amplification stage. This PIN network 22 is continuously variable in response to a temperature compensation voltage furnished by a thermistor bridge network 25. In thermistor network 25, resistance $R_1$ receives a steady regulated reference voltage $V_1$ from a regulated power supply. The requirements of the remainder of the system, including klystron 28 (FIG. 1) are also preferably furnished by the regulated power supply. The regulated supply may take many forms as well known in the art; preferably, however, the supply is one as shown in copending application Ser. No. 367,646, filed 4-12-82 of J. F. Brown, entitled "Feed Forward AC Voltage Regulator Employing Step-Up, Step-Down Transformer and Analog and Digital Control Circuitry", and assigned to the present assignee. In series with resistance $R_1$ is thermistor 30, the other side of which is grounded. A second resistance $R_2$ is connected between $R_1$ and thermistor 30 to PIN network 22 to supply a control voltage thereto. This voltage is denominated the temperature compensation voltage $V_t$, since due to the action of thermistor 30, it will decrease (and thus PIN diode network 22 in response thereto imposes less attenuation) as the ambient temperature of the amplifier system increases. This action of course tends to compensate the natural tendency of the remainder of the components to increase in resistance, and thus to cause increased attenuation, as the ambient temperature increases.

The variations of the temperature compensation voltage $V_t$ are made to quite exactly follow inversely to the variations in resistance and attenuation normally exhibited by the remainder of the system, by choosing the appropriate values of resistance for the thermistor network. In this manner, the variations in power output of the system at given operator-selected power settings which would otherwise be caused by ambient temperature changes are compensated.

The signal then is directed to a final FET preamplification stage 31 before being passed through preamplifier output isolator 32 and then to klystron amplifier 28. The use of the input and output isolators preserves the signal free from multiple reflections and consequent phase shifts and non-linearities. The high power amplification is then performed by klystron 28; for example, a VA 936 manufactured by Varian Associates, Inc. Such a tube is typically provided with a channel selector mechanism allowing any one of a plurality of different channels to be selected for operation. The klystron output signal is directed to a waveguide coupler/output 34 of converted design which includes a high power circulator and directional coupler having several ports, to permit sampling for various monitors.

The level of power output is initially chosen by the operator by manipulation of the optical shaft encoder 35, which provides pulse trains ultimately acting as control signals for adjusting the degree of attenuation in preamplifier 12 in correspondence to the degree of rotation of the shaft of the encoder. Encoder 35 is coupled to preamplifier 12 via mode selector switch means 36 and through SIPO (serial-to-parallel) counter/converter 21. Encoder 35 is a commercially available optical encoder which may be rotated through a considerable angular range, and outputs two pulse trains A and B in quadrature relationship, to preserve the direction of the adjustment as an increase or decrease. The number and direction of output pulses are indicative of the degree of angular rotation of the shaft. The range of rotation of the shaft is correlated with the range of the available attenuation from preamplifier 12.

In the preferred embodiment, for example, an optical encoder configuration which can provide approximately 25 pulses per revolution, or 250 pulses in 10 revolutions, is utilized. This is for best compatibility with the 8-bit PIN diode step attenuator 16, which can increment through a nominal 256 steps. As best shown in FIG. 2, it is to step attenuator 16 that the encoder control signals for the preamplifier are ultimately directed. Since as mentioned above, the step attenuator has an overall 25 decibel range, each such pulse is conveniently associated with a 0.1 decibel attenuation value.

Mode selector switch means 36 has at least two operating positions, a first position for manual control of the amplifier output, and which connects encoder 35 to counter/converter 20 and ultimately to preamplifier 12; and a second servo position for disconnecting encoder 35 and connecting instead a servo means 37 (to be described) to preamplifier 12 through counter/converter 21, to automatically preserve the desired level of power output. Serial-to-parallel counter/converter 21 conditions the control signals from shaft encoder 35 to count, hold and convert same from a serial format to a parallel format suitable for PIN diode step attenuator 16. As more particularly shown in FIG. 3, converter/counter 21 includes an 8-bit binary counter means 38, and a phase gate steer logic 39. When mode switch 36 is in the manual control position, steer logic 39 receives the pulse train pair output of optical encoder 35. Logic 39 then detects the direction of change, and depending on its direction, increments 8-bit counter 38 upwardly or downwardly by the appropriate number of counts within its 256 count range.

Especially during manual resetting of the power level, counts may accumulate rapidly on counter 38 as they are clocked in from steer logic 39. During both manual power reset and power servo-maintained modes of operation, a low-high count limiter 40, whose input is connected to the output of counter 38, and whose output is connected to a control input of counter 38, monitors the total on 8-bit counter 38, and prevents rollover in the event the counter threatens to become overloaded. Upon completion of the manual resetting of power level by the operator, the 8-bit counter means 38 has logged the counts representing this power setting. The counts are maintained by the battery-operated timer 42 so that the setting as represented by the logged counts is preserved even in the event of power interruption.

Thus in the manual mode, when the operator desires to adjust power output to a new setting, an appropriate rotation of the shaft encoder 35 will cause attenuation to change rapidly and over a wide range to reset power to any desired setting in the operating range. Once the system is switched from the manual mode to the servo mode as will be described further below, the servo means 37 is instead connected to counter/converter 21 while encoder 35 is disconnected. The setting of counter 38 thereafter may change in response to an error signal from the servo means, if the latter detects that a change in power output level has occurred. Since these error signals are not in quadrature as are those from optical encoder 35, switch 36 connects them directly to counter 38, bypassing steer logic 39. The error signal then directly increments or decrements counter 38; they are conditioned into the parallel format necessary for step attenuator 16; and the level of attenuation thereafter is controlled in accordance to the total of counts, and any change therein.

Returning to FIG. 1, it will be recalled that waveguide coupler/output 34 is provided with several ports, to permit monitoring. One such port is shown schematically at 46; the sample output is directed therefrom into the microwave output power monitor 47. This monitor is of conventional design, incorporating a tunnel diode and preamplifier to absorb the incident microwave power to generate an analog DC voltage proportional to the microwave power. Power detection is on a CW or optionally on a peak power basis. Other types of power monitors may also be used; for example, one incorporating a number of thin film thermoelectric junctions which operate as a well-matched termination to absorb the incident microwave power. The absorbed power results in an analog voltage proportional to the microwave power output.

The power monitor amplifies and feeds the voltage representative of the actual power to the main logic 48, which includes first input interface 49 and second input interface 50, output interface 52, and a microprocessor 54. The latter is, for example a Z80 type, and processes the inputs under the direction of a PROM memory 55 suitably programmed as described below. Main logic 48, along with counter 38, step attenuator 16, and output power monitor 47, comprises the core of the aforementioned servo means 37 functioning to stabilize the system's output power at the operator-preselected setting.

The analog signal from output power monitor 47 is converted into digital form by an analog-to-digital converter 56 of the main logic. The A to D converter samples the analog signal at a rate of 4 Hz, and then directs the digital representation of the power output into the microwave processor via first input interface 49. Second input interface 50 is provided with a two-position software select key 57, and a reset switch 58. Main logic 48 is programmed to recognize a first position of key 57 as selecting a servo mode for logic 48, and as inactivating the second interface; and to recognize the second position as selecting an interface-active mode. In this second position, the second interface, which also receives the digital representation of the instantaneous actual power output of the system, is activated to read and store the same.

The software select key 57 is designed to work in conjunction with mode select switch 36 and encoder 35, so that when mode switch 36 is selected for manual operation, and the operator is selecting a desired power level, or resetting the system to a new desired power level, the key 57 is placed in its second position, and the corresponding digital signal is being entered into second input interface 50, as well as into the remainder of the main logic. Once the power output has been thereby set to the desired new level, software key 57 is then switched to its servo mode, inactivating the second interface for further input as to power levels. Reset switch 58 is then manipulated to cause second input interface 50 to be read and the digital representation of the actual power level which was last received just prior to interface inactivation to be stored by the main logic. This stored value of power then becomes the nominal power level against which the main logic will cause the system output power to be stabilized.

Finally, mode selector switch 36 is repositioned from the manual to the servo mode, thereby disengaging encoder 35 from counter/converter 21, and connecting thereto main logic 48. Thereafter, until the foregoing operations are repeated in order to reset the system to a new operating power level, the power level of the system is automatically maintained against fluctuations by the servo action of main logic 48 providing error signals to counter/converter 21 and ultimately preamplifier 12 to compensate for any changes. As described above, the error signals (now directly sent to counter 38 as shown in FIG. 3) adjust the attenuator 16 of the preamplifier to affect any necessary compensation in power level.

The microprocessor is in this manner supplied with two signals, one representing actual power output level, and the other the operator-selected nominal power level at which it is desired to stabilize the actual power output of the system. It then does a comparison in accordance with a predetermined protocol to derive control signals to adjust preamplifier 12 to maintain the operator preselected power output.

The microprocessor is directed by a program placed within PROM memory 55 to process these two signals according to the flow chart shown in FIG. 4. A narrow error band within which the actual power level will be allowed to deviate without triggering corrective action is previously preset. As shown in FIG. 4, the microprocessor compares the two signals, and if the comparison shows the absolute value of the difference therebetween to be within the error band, then a short wait period T occurs (which period is preselected to be comparable to the reaction time of power monitor 36). Upon completion of the wait T, the procedure recycles, and the comparison step again is implemented. If, on the other hand, upon comparison of signals the absolute value of the aforementioned difference falls outside of the range of the preselected error band, then the further comparison is made to determine whether the actual microwave output has become greater than or less than the preset power level. If greater, then the microprocessor generates an error signal to cause an increase in attentuation. This error signal is directed to converter/counter 21 as described above to increment counter 38 therein, and thereby ultimately to step attenuator of preamplifier 12 to result in an incremental increase by one step in the attenuation imposed by preamplifier 12.

If instead, the actual output has become less than the operator preselected power level, then the appropriate error signal is generated to result in a decrease in the attenuation by one step in step attenuator 16. Whether the microprocessor-generated error signal directs a decrease or increase in attenuation, it is again delayed by the same short wait T, to allow power monitor 47 to stabilize, to ensure the accuracy of its reading of actual power output, and thus of the correction. Each comparison and correction cycle resulting in an error signal to raise or lower the attenuation can do so only in steps, here equivalent to 0.1 decibel of attenuation, as mentioned above. Further corrective iterations are automatically performed as long as the actual power differs from the preset power by an amount greater than the preset error band, until the output is stabilized at the desired preselective level, to within an accuracy determined by the preset error band.

With the placement of the system in the servo or maintenance mode of operation by placing mode switching means 36 in the servo mode, the counter/converter 21 is now only receptive to the error signals from main logic 48. The comparatively slow corrective changes in one-step, 0.1 decibel increments whenever the aforementioned comparison detects a drift in power greater than the preset error band, are continuously repetitively performed at intervals corresponding to the aforementioned wait period T. Such time intervals between corrective iterations are deliberately somewhat large not only to accord with the characteristics of power monitor 47, but also to minimize overshoot effects and reaction to transient effects, in favor of focusing on the recognition of only true long term changes in power output.

It might be noted that the power output drift from the operator-selected level is compensated no matter what the source, and regardless of whether originating with the preamplifier, the klystron, or even the signal input means external to the amplifier system itself. The drift is compensated regardless of whether it originates by virtue of changes in component resistive values or other values because of operating temperature or ambient temperature changes, or whether due to lessening of efficiency due to component aging. Reliability is thus very high due to the essentially all solid state components and the relative simplicity of both the components and the system into which they are arranged. Unlike other expedients, the compensation of the scheme is inherently more stable than the amplifying means itself. The power compensation scheme is well integrated with the power selecting and resetting function, as well as the microprocessor control, and the number of components and the complexity of the overall system is lessened in this way. By the same token, many of these components of the compensation means also may be made to handle other important functions of the system as well, in particular the microprocessor. The solid state design is not only compatible with other modern satellite communications equipment, but also facilitates interaction with such other equipment as well as with remote computerized controls.

What is claimed is:

1. A stabilized klystron power amplifier system for use with a regulated voltage supply furnishing a regulated voltage, said system comprising:
   a klystron amplifier tube;
   solid-state preamplifier means for driving said klystron, said preamplifier having a variable gain as a function of temperature;
   means for periodically sampling the actual microwave output power from said klystron;
   means for converting said periodic sample to a digital signal representing said actual output power;
   microprocessor means for comparing said digital signal to digital reference signals representative of a reference output power level and generating digital correction signals;
   first solid-state variable attenuator means in series with said preamplifier means for varying the gain of said preamplifier in response to said correction signals;
   means for furnishing a compensation voltage varying inversely to said variable gain in response to changes in ambient temperature, said means accepting said regulated voltage for reference purposes;
   second solid-state variable attenuator means in series with said preamplifier means and responsive to said compensation voltage for varying the gain of said preamplifier accordingly;
   whereby the magnitude of said output power is stabilized at said reference power level.

2. A system as in claim 1, which further includes means for switching out said microprocessor-derived correction signals and substituting alternate digital correction signals for said first attenuator means; and first input interface means for supplying said alternate signals to said microprocessor to update said digital reference signals.

3. A system as in claim 2 which further includes second input interface means for said microprocessor, and in which said microprocessor means includes memory capability, said microprocessor responding to signals relayed through said second interface to store the value of the sampled signal representing the instaneous actual power output, said stored value thereupon becoming the digital reference signal representative of the desired preselected output power level.

4. A system as in claim 1 which further includes a digital encoder means providing a signal representative of said reference output power.

5. A system as in claim 4 which further includes digital switch means controlling the input of said signals to said first variable attenuator means, and enabling operator selection of correction signals from alternate sources, including said correction signals from said microprocessor means, or correction signals from said digital encoder means.

6. A system as in claim 4 in which said encoder means is a rotatable shaft encoder providing a pair of pulse trains in quadrature, representative of the changes in magnitude and direction of increase or decrease from the previous reference output power.

7. A system as in claim 4 in which said encoder means is a digital optical shaft encoder having an operator-controllable indicator representative of various preselected output power levels.

8. A system as in claim 1 in which said means for sampling the actual power output includes a microwave power monitor to absorb incident microwave power and generate a voltage proportional thereto.

9. A system as in claim 1 in which said means for furnishing a compensation voltage in response to ambient temperature includes a thyristor bridge network referenced to said regulated voltage, and furnishing said compensation voltage.

10. A system as in claim 1 in which said second variable attenuator is a PIN diode network controlled by said compensation voltage to adjust the attenuation of the gain of said preamplifier means so as to compensate for the effect of ambient temperature changes.

11. A system as in claim 1 in which said first variable attenuator is a PIN diode network responsive to said digital correction signals.

12. A system as in claim 11 in which said PIN diode network is responsive to said digital correction signals to impose attenuation in discrete steps.

13. A system as in claim 12 which further includes a counter/converter means, said microprocessor means furnishing said correction signals in the form of a series of digital pulses, said counter/converter means reordering said signals from serial format to parallel format, said PIN diode network responding to said reordered correction signals.

14. A system as in claim 13 in which said counter/converter includes a phase gate steer logic accepting said quadrature signals from said encoder to detect the direction of change of said error signal pulse train; and binary counter means to maintain a log of total counts representing incremental attenuation level, said counter communicating with said diode network.

15. A system as in claim 12 in which said PIN diode network is a 8-bit digital network, and in which said counter is an 8-bit binary counter, whereby attenuation in 256 discrete steps may be provided.

16. A stabilized klystron power amplifier system for use with a regulated voltage supply furnishing a regulated voltage, and with a klystron amplifier tube, said system comprising:

said preamplifier means for driving said klystron, said preamplifier having a variable gain as a function of temperature;

means for periodically sampling the actual microwave output power from said klystron;

means for converting said periodic sample to first digital signals representing said actual output power;

digital encoder means for providing second digital signals representative of a desired power output level, said means including an operator-controlled indicator for selecting said desired output level;

solid-state digital attenuator means for adjusting the power output of said preamplifier means upwardly or downwardly in accordance with control signals;

solid-state control signal generator means including a microprocessor for comparing said first and second digital reference signals, and for sensing ambient temperature, said means furnishing said control signals to said attenuator means to control attenuation of said power output as an inverse function of temperature, and to increase or decrease attenuation in accordance with whether said first digital reference signal is less than or greater than said second digital reference signal;

whereby the magnitude of said actual output power is stabilized at said operator-preselected desired power output level.

17. A system as in claim 16, in which said control signal generator means includes a thyristor bridge network referenced to said regulated voltage for sensing said ambient temperature.

18. A system as in claim 16, in which said attenuator means includes at least one PIN diode network controlling the power output of said preamplifier in response to said control signals.

19. A system as in claim 18, in which said control signals include digital error signals, and said PIN diode network is responsive to said digital error signals to impose said power output control in discrete steps.

20. A system as in claim 16 in which said system further includes operator manipulable mode switch means receiving both signals from said encoder, and signals from said control means, and selecting between said encoder-originating signals and said control means-originating signals to provide input signals to said digital attenuator means.

21. A system as in claim 20 in which said microprocessor includes memory means, and is operator-activated to store the value at the time of such activation of said digital signals representing the sampled actual power output, said stored value thereafter becoming the value of the desired power output level for purposes of comparison to subsequent digital signals representing said sampled actual power, to obtain said control signals to be furnished to said attenuator means.

22. A system as in claim 16 in which said digital encoder means provides a pair of digital signals in quadrature, and in which said digital attenuator means further includes means for decoding said signals to provide serial digital attenuation correction signals.

23. A system as in claim 16 in which said digital attenuator means further includes binary counter means receiving said serial digital correction signals from either said means for decoding or from said solid state control means, the level of counts of said counter then determining the level of power output of said preamplifier.

* * * * *